US007893521B2

(12) United States Patent
Lunenburg et al.

(10) Patent No.: US 7,893,521 B2
(45) Date of Patent: Feb. 22, 2011

(54) ELECTRIC FENCE ENERGISER

(75) Inventors: Pieter Cornelis Lunenburg, Waiuku (NZ); Robert Charles Bryan Woodhead, Auckland (NZ); John Murphy, Auckland (NZ)

(73) Assignee: Tru-Test Limited, Auckland (NZ)

( * ) Notice: Subject to any disclaimer, the term of this patent is extended or adjusted under 35 U.S.C. 154(b) by 1409 days.

(21) Appl. No.: 11/242,724

(22) Filed: Oct. 3, 2005

(65) Prior Publication Data

US 2006/0087178 A1 Apr. 27, 2006

(30) Foreign Application Priority Data

Oct. 4, 2004 (NZ) ...................................... 535719

(51) Int. Cl.
*H01L 27/06* (2006.01)
*H02M 3/18* (2006.01)

(52) U.S. Cl. ....................... 257/532; 257/299; 257/577; 307/110

(58) Field of Classification Search ................. 257/296, 257/532, 299, 577; 307/110
See application file for complete search history.

(56) References Cited

U.S. PATENT DOCUMENTS

2002/0079909 A1 6/2002 Reeves
2003/0151410 A1 * 8/2003 Hamm et al. ............... 324/509
2007/0182362 A1 * 8/2007 Trainor et al. ............... 320/101

FOREIGN PATENT DOCUMENTS

WO WO 96/36203 A1 11/1996
WO WO 00/35253 6/2000

* cited by examiner

*Primary Examiner*—Mary Wilczewski
*Assistant Examiner*—Toniae M Thomas
(74) *Attorney, Agent, or Firm*—Blakely, Sokoloff, Taylor & Zafman, LLP

(57) ABSTRACT

An energiser for an electric fence. The energiser includes, at least, one energy storage capacitor (14), a charging circuit (13) to enable the or each storage capacitor (14) to be charged from an energy source (10), semiconductor switching means (16), and control circuit means (15) to facilitate controlled turning -on and -off of the semiconductor switching means (16) to control the duration of the discharge from the energy storage means (14). In one form of the energiser a first semi-conductor switching means is arranged to connect in parallel the energy storage capacitors (14) to be charged and second semi-conductor switching means to connect two or more of the charged energy storage capacitors (14) in series to create an output pulse.

16 Claims, 8 Drawing Sheets

ELECTRIC FENCE ENERGISER

BACKGROUND TO THE INVENTION

This invention relates to an electric fence energiser.

The term energiser in connection with electric fencing is commonly used to indicate a generator of a high voltage output which can be connected to an electric fence to electrify the fence. Other terms used to identify this piece of electric fencing equipment include fence controller, electrifier, charger, pulse generator and the like.

Electric fencing is widely used for the control of livestock animals, game, perimeter security installations and possible other uses. In such installations, the energiser performs the function of supplying a high voltage to one or more conductors of the electric fence with the aim of providing an electric shock to an animal or a person touching one or more of the conductors. The high voltage on the fence conductors may be present in the form of intermittent pulses of short duration, or as a continuous AC or DC voltage.

A significant proportion of energisers provide intermittent high voltage pulses of short duration to the electric fence. Other energisers provide continuous high voltage DC or AC. The reasons for the popularity of the pulsed type of energiser are many. One of the reasons is that for most practical electric fence installations the pulsed type of energiser is capable of providing a more powerful electric shock than other types of energisers, and thus provides a better deterrent for animals or persons attempting to cross the barrier formed by the electric fence.

Currently there are three main types of electric fence energisers used in the field of electric fencing. One type, which accounts for the majority of energisers, is a capacitor discharge model with a step-up transformer. This type of energiser operates by discharging one or more energy storage capacitors through a primary winding on the transformer. The secondary winding, which typically has a greater number of turns than the primary winding, thereby transforms the voltage that is imposed across the primary winding to a higher voltage. The secondary winding is usually directly electrically connected to the electric fence.

A semiconductor switching device is held in the off (blocking) state to allow charging of the energy storage capacitor(s). When charging is complete the switching device is placed in the on (conducting) state to rapidly connect the capacitor to the primary winding of the transformer thereby allowing a rapid discharge and production of a high voltage pulse.

There are a number of reasons why this type of energiser has become the most popular. These include:—

Energy storage capacitors with rated voltages between 250V DC and 1200V DC are mass-produced, are low cost and readily available.

Thyristor switching devices with rated voltages between 400V DC and 1200V DC are also mass-produced, low cost and readily available. In addition, in a high-energy energiser a large current flows through the switching device, the capacitor and the transformer primary winding during the pulse (in the order of several hundreds of amperes to over a thousand), which can be tolerated by the same low cost thyristors.

A peak pulse voltage of 1200V is generally considered insufficient (too low) to effectively deter animals (livestock) from crossing a barrier formed by an electric fence. As a general rule, pulses with a peak voltage of 3000V and higher are considered adequate.

Electric fence energisers powered from the AC mains and some models powered by battery generally have an electrical safety isolating barrier between the AC mains terminals and the fence terminals. This barrier is mandatory in the interest of safety. The step-up transformer is constructed to perform a dual function:

(1) To increase the voltage from between 400 . . . 1200V to more than 3000V as required for effectiveness of the electric fence barrier.

(2) The mandatory electrical isolating barrier is most easily constructed between the primary and the secondary winding of the step-up transformer.

A second type of electric fence energiser is the inductive discharge model in which the step-up transformer functions as the energy storage device as well as the means of increasing the pulse output voltage to the desired level. Thus in this type of energiser energy is stored in the magnetic field (iron core) of the step-up transformer by allowing a current to build up in the primary winding of the transformer. When this current is abruptly interrupted (typically by using a semiconductor switching device such as a power MOSFET or a BJT), a high voltage pulse is developed across the windings of the transformer.

This type of energiser is not very popular mostly because it is limited to maximum power levels that are considerably lower than what can be achieved using the capacitor discharge topology. In addition, controlling the maximum pulse voltage may require additional components such as high voltage varistors (MOVs).

The third type of energiser is a DC fence charger, typically formed by placing a constant high DC voltage on the fence conductors by means of a low current (high impedance) voltage multiplier circuit. These types of energisers are predominantly used in North America. The charger typically is constructed using a “capacitor and diode” voltage multiplier chain, rectifying and multiplying mains input voltage up to the desired output voltage. Either the output of the chain is connected to the fence conductors via relatively high impedance, or the mains input is connected to the chain via similarly high impedance. The high impedance is mandatory for this type of energiser to ensure safety.

This type of energiser is limited to very low power levels due to the required high impedance.

Both capacitor discharge type and inductive discharge type energisers tend to be wasteful of energy for many load conditions. In an energiser that may be considered state-of-the-art about 20% or more of the stored energy is lost in the electronic components forming the pulse generating circuit, even under the most favourable load conditions. For loads other than the most favourable value the loss increases and reaches 100% for many designs under open-circuit load conditions. Whilst such energy loss is often not of concern for low- and medium-energy energisers, energy loss in internal circuits can become a problem for high-energy energisers. In addition, if an energiser is supplied by an energy-limited supply such as a battery or a solar panel it is desirable to minimise energy losses to maximise battery life and/or to minimise size and cost of the battery and/or solar panel.

One of the components responsible for a significant amount of energy loss is the step-up transformer employed in both the capacitor discharge- and the inductive discharge-type of energiser. Especially in high-energy energisers the step-up transformer is a major source of energy loss due to resistive losses in the copper windings, hysteretic and eddy current losses in the magnetic core and poor inductive coupling of the windings due to saturation of the magnetic core material.

It is possible to improve the efficiency of the step-up transformer by configuring the transformer as what is commonly known as an auto-transformer, wherein the primary and secondary windings are not electrically isolated. However, whilst the auto-transformer mostly offers an improvement by way of better coupling between the windings, the other losses associated with step-up transformers remain largely or entirely the same and the advantage of improved coupling may be partially lost if the magnetic material of the core becomes saturated during the pulse.

Energisers generally comply with international and national safety standards. In particular, limits are applied to the minimum pulse interval duration, the maximum amount of energy and/or the maximum magnitude and duration of the electric current per pulse that an energiser is allowed to supply to certain standard load impedances connected to the energiser. Although capacitor discharge type energisers can be easily made to comply with such safety standards, such energisers still have a limited amount of control over the three pulse parameters energy, current and duration. Many designs overcome some of the limitations by regulating the voltage to which the energy storage capacitor is charged, and some designs also provide the ability to discharge more than one capacitor or bank of capacitors, thereby attempting to maximise pulse voltage for a wider range of load impedances than is possible with just a single energy storage capacitor or bank of capacitors.

The step-up transformer used in conventional energiser designs places a severe restriction on the maximum pulse width that can be achieved, because the magnetic core material tends to become saturated for longer pulse durations.

A capacitor discharge energiser with a step-up transformer generates a current in the primary winding that can reach hundreds of amperes for low- to medium-energy designs and may reach thousands of amperes for high-energy designs. To be able to control and switch currents of this magnitude the preferred device is a thyristor, also commonly known as a silicon controlled rectifier SCR. Sometimes a triac is used.

A limitation of a thyristor and triac is that it is difficult to turn the device off (i.e. revert the device to the non-conducting state) once it is placed in the conducting state. In a practical situation this means that most or all of the energy stored in the energy storage device is transferred and/or dissipated before the thyristor or triac returns to the non-conducting state. The difficulty in turning off the switching device therefore is the reason, in most current energiser designs, for a limitation on the minimum pulse duration that the energiser can produce.

Many attempts have been made to overcome problems inherent with electric fence energisers of the aforementioned type. Many of these attempts have focused on an energiser which can be controlled so as to vary the output essentially in response to load on the electric fence. One approach has been to incorporate multiple energy storage capacitors and then use a control circuit to allow one or more of the capacitors to discharge, the number of capacitors being discharged being in response to a sensed load on the fence.

Another approach has been to charge the storage capacitor to a level commensurate with a load sensed on the electric fence so that upon discharge the required energy level is transferred to the fence.

Yet another approach proposes circuitry in which there are a number of storage capacitor/step-up up transformer combinations and control means to trigger one or more of the combinations dependent on the sensed load on the fence line.

All of these approaches have been intended to deal with problems inherent with known constructions of energiser though, more particularly, with capacitor discharge type energisers. By controlling the energy stored in or discharged from the energy storage device(s) using one of the abovementioned methods, the amount of energy output at each discharge can be controlled for either energy conservation or safety purposes. Also, factors such as heat build up in the energiser can be improved.

In all of these approaches the output is controlled by the amount to which the energy storage capacitor is charged or the number of energy storage capacitors which are discharged to create the output pulse.

SUMMARY OF THE INVENTION

The object of the present invention is to provide an electric fence energiser in which the duration of the output pulse is controlled over a wide range to thereby control output energy.

Broadly according to one aspect of the invention there is provided an energiser for an electric fence, the energiser including, at least, one energy storage capacitor, a charging circuit to enable the or each storage capacitor to be charged from an energy source, semiconductor switching means, and control circuit means to facilitate controlled turning -on and -off of the semiconductor switching means to control the duration of the discharge from the energy storage means.

Preferably the energy storage means is a capacitor or a multitude of capacitors that can be charged to a desired pulse output voltage.

Preferably the energiser does not employ a step-up output transformer.

In a preferred form the semiconductor switching device is selected from an insulated gate bipolar transistor (IGBT), a bipolar junction transistor (BJT) or a power MOSFET (metal oxide semiconductor field effect transistor) or a multitude of said devices.

In one form of the invention the switching device is constructed from a multitude of devices and the turn-on and turn-off speed of the individual devices is controlled by means of components connected to the devices.

Preferably the energiser calculates the energy delivered to a load connected to the output terminals by measuring the energy stored in the energy storage device(s) prior to and after each output pulse and calculating the difference.

The energy source can be AC mains power supply, a low voltage DC or AC power supply, such as a battery and/or solar panel, or a combination of low voltage DC or AC and AC mains power supply.

The energiser is capable of producing a series of pulses of controlled amplitude, duration and separation in place of a single pulse of equivalent energy. The series of pulses can be used for fence wire communication and to selectively control other devices connected to conductors of an electric fence, or for the transmission of other information over said conductors. Due to high voltage, high power output capability of the energiser the effectiveness of the information transmission system would be superior in performance to that normally associated with known techniques available and could become the primary function of the energiser over animal control.

In one form the energiser is arranged to be controlled by a remote control means, whereby the attenuation of the remote control signal associated with energisers that incorporate a step-up transformer connected to the fence is largely avoided on account of the high impedance presented by the semiconductor switching means in the blocking (non-conducting or off-) state.

According to a second broad aspect of the invention there is provided an electric fence energiser including a plurality of energy storage capacitors, a charging circuit to enable at least some of the energy storage capacitors to be charged from an energy source, first semi-conductor switching means arranged to connect in parallel the energy storage capacitors to be charged and second semi-conductor switching means to connect two or more of the charged energy storage capacitors in series to create an output pulse.

BRIEF DESCRIPTION OF THE DRAWINGS

In the following more detailed description of the invention reference will be made to the accompanying drawings in which:—

DESCRIPTION OF PREFERRED EMBODIMENTS OF THE INVENTION

Figure 1:
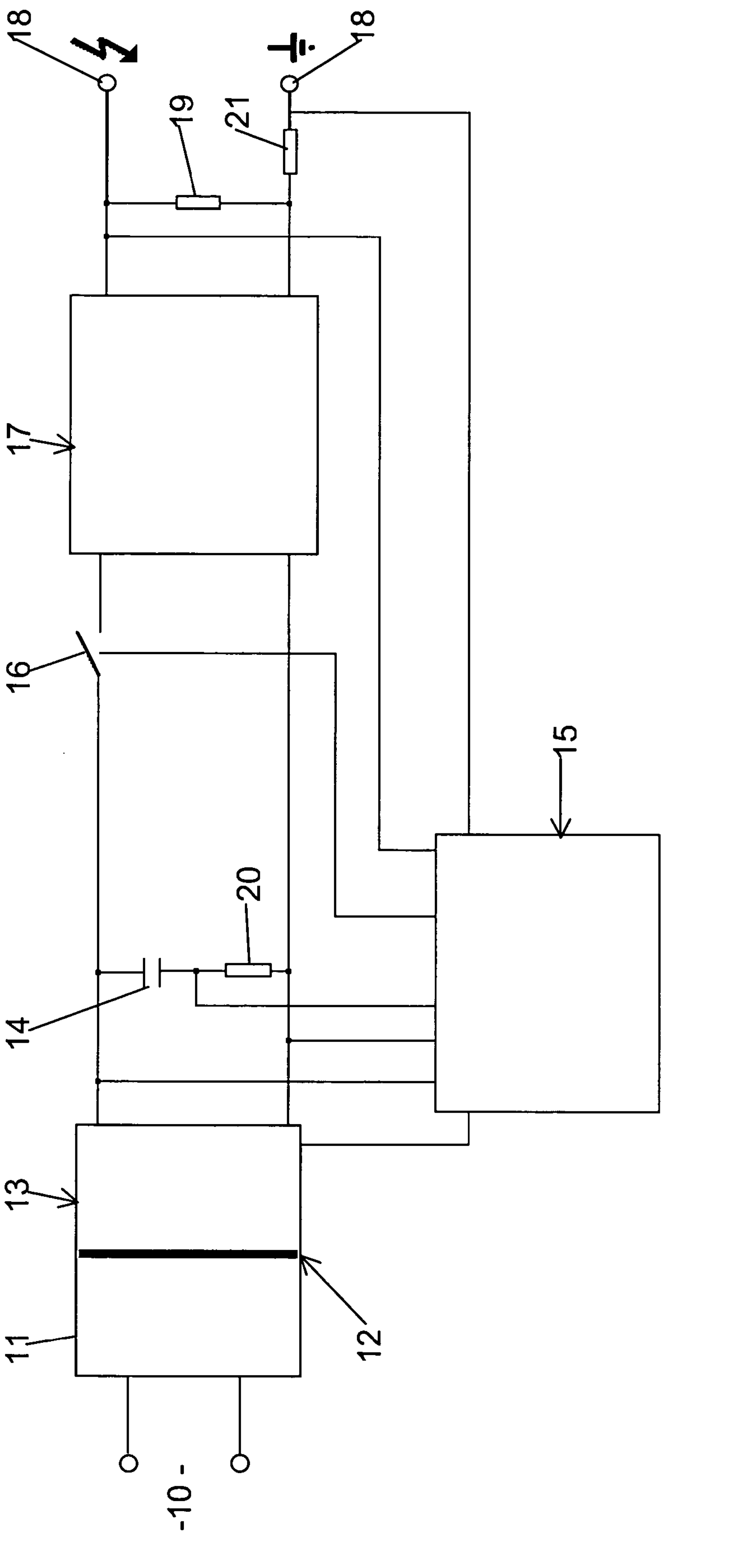
FIG. 1 is a block diagram of an energiser according to the present invention.

Referring to FIG. 1 there is shown an electric fence energiser which is powered from an energy source 10, which may be AC mains supply, a battery, solar panel or other source. The power source is connected to power supply circuit 11 which may incorporate an electrical isolation barrier 12. The power supply circuit 11 is coupled to charging circuit 13 which, as shown, has its output connected to a high voltage energy storage capacitor 14. The capacitor 14 is able to be charged up to the required (or desired) output voltage. As previously described, energy storage device 14 may be a single capacitor or a plurality of capacitors connected together.

The charging means 13 may be a switch mode power supply, a diode-capacitor voltage multiplier (rectifier) chain, a mains supply step-up transformer or other means of generating a voltage equal to the desired pulse output voltage.

The energiser further includes measurement and control circuits 15 and a high voltage switching device 16.

In a preferred form of the invention the switching device 16 is a transistor capable of blocking a high voltage and also capable of conducting a pulse current at least equal to the maximum pulse current that the energiser delivers to the fence conductors. Choices for a transistor are a BJT, power MOSFET, IGBT and possible other devices.

With present state-of-the-art semiconductor switching devices, the IGBT is the preferred choice. The IGBT is a state of the art semiconductor device that is mass produced and low cost but is suited to switching medium to high currents (tens to hundreds of amperes) and is also able to withstand voltages of at least 1200V DC. Recent advances in IGBT technology have made devices available that are capable of withstanding short circuit loads at rated voltages for limited duration. The IGBT device offers the advantage of being easily controlled by a gate voltage rather than a gate trigger current. The IGBT can also be easily turned off (returned to a blocking state) by removing the gate voltage.

Although it is possible to force SCR devices to turn off, for example by using a second SCR to divert all the load current away from the first SCR long enough to allow it to commutate, this is difficult to implement and also cannot generally be achieved in short periods (a few microseconds) without the use of costly specialised SCR devices. The present invention does not require costly commutation circuits, nor the more complex gate trigger circuit designs which are necessary for gate-turn-off thyristors.

The output from the energiser can pass through pulse shaping and/or filter circuits 17 to the electric fence energiser output terminals 18. Filter circuits may be required to meet national or international radio frequency interference regulations. The filter circuits may also offer some advantage in the way of protection for the switching device from externally generated transient voltages that may be present on the conductors of the electric fence.

Preferably a fence discharge resistor 19 is provided to enable the fence conductors connected to the energiser and filter capacitor(s) to discharge and return voltage on the fence conductors to a low level within a time that may be considered safe.

Measurement and control circuits 15 are included to control the switching device 16. Additional functions of circuit 15 may be:

- control of the charging means,
- measurement of the voltage on the energy storage device,
- measurement of the discharge current flowing through the energy storage device and the switching means by way of series resistor 20, alternatively a current transformer may be used for this function,
- measurement of the peak pulse voltage,
- measurement of the peak pulse current by way of series resistor 21, alternatively a current transformer may be used for this function,
- generation and encoding of transmission pulses for communication with, and control of, remote devices using the fence wire as a transmission line.
- reception and decoding of signals from other remote devices using the fence wire as a transmission line.
- reception of voltage pulses or signals received from other energisers over the fence conductors. This can ensure farm safety through synchronising or automatic shutdown.
- measurement of the internal temperature and possible other parameters relevant to the operation of the energiser.

It is notable that in the energiser, according to the present invention, no step-up transformer on the output side of the energiser is present. Therefore, while the energiser operates on the known principal of charging an energy storage capacitor and discharging the capacitor it does not employ a step-up transformer.

As a result the energy storage capacitor 14 is first charged to the desired peak pulse voltage for the electric fence (e.g. 8000V to 10000V) and then connected to the electric fence conductors (connected to one or both outputs 18) by means of the high voltage switching device 16. Accordingly an energiser incorporating the present invention could be referred to as a “switched DC energiser”. By the use of an IGBT it is possible via the control circuit 15 to arrive at a controlled turn-off of the switching device 16.

It will be appreciated by those skilled in the art that the controlling switching element or device 16 can be a single IGBT or a multitude of IGBTs as will hereinafter be described in one preferred embodiment (FIGS. 2A and 2B) of an energiser incorporating the present invention.

According to the present invention the output pulse can be ended simply by turning the controlling switching element or device off. Therefore the output pulse duration can be fully controlled by the switching element or device for each individual pulse. A possible range of pulse durations is 1 microsecond minimum to 10 milliseconds maximum i.e. a 10,000:1 ratio. A practical design may offer a range of pulse duration from 5 microseconds to 500 microseconds, a ratio of 100:1 which is at least an order of magnitude better than any conventional design.

In contrast, control of pulse duration in traditional designs is possible only to a small extent by means of capacitor (bank) switching or thyristor stagger triggering and is limited to a ratio of much less than 10:1. This is due to the aforementioned difficulty of turning off a thyristor.

The invention also offers the added advantages that pulse voltage can be maintained with a degree of independence from energy delivered and with a degree of independence from the load impedance.

Figure 3:
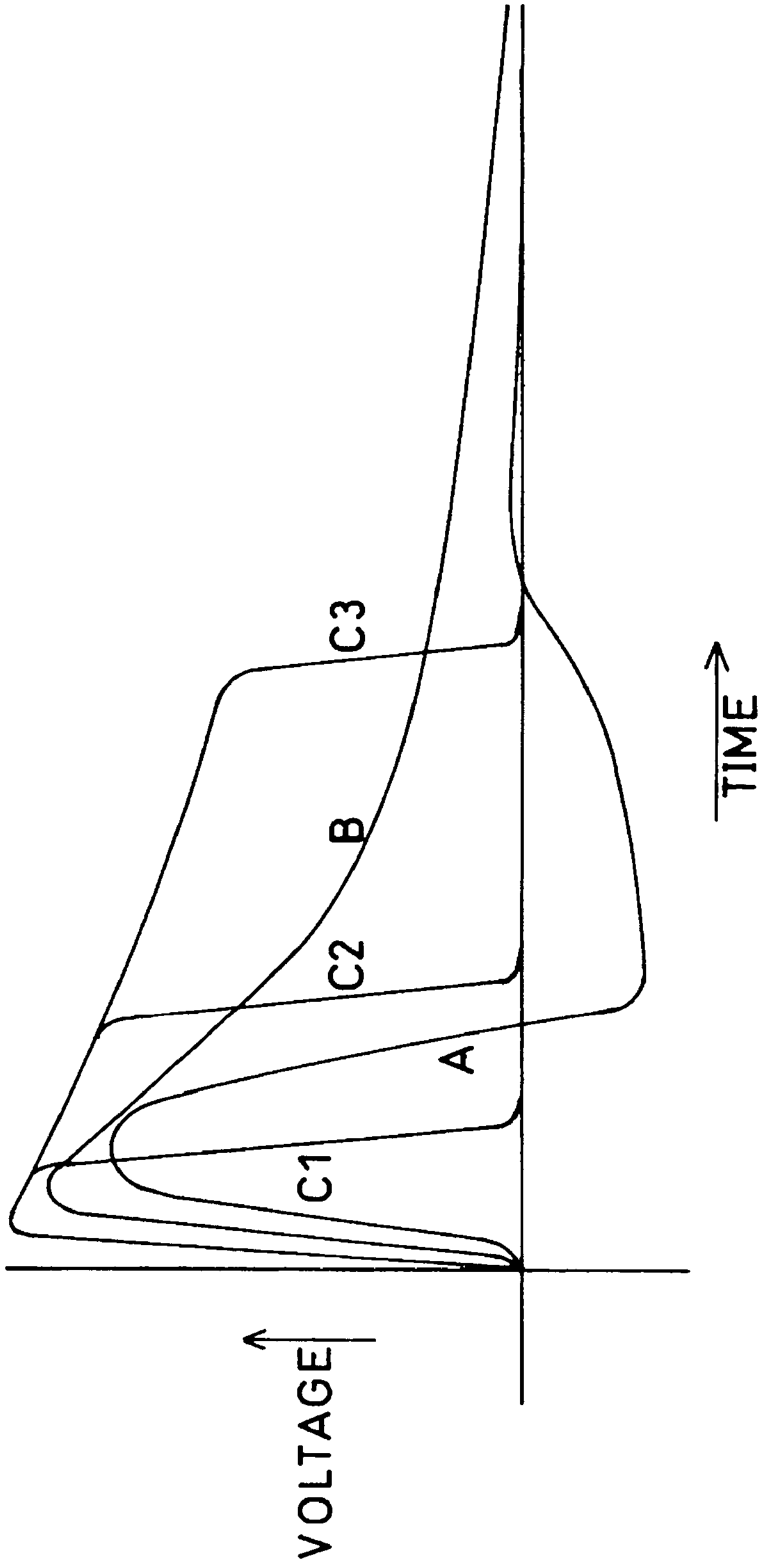
FIG. 3 is a graphical representation of pulse voltage waveforms.

The improved degree of control over pulse waveform and duration that the invention offers over prior art energisers is illustrated in FIG. 3, which shows pulse voltage waveforms that approximately resemble waveforms as produced by practical implementations. The curve marked ‘A’ is a waveform that is typical for a conventional capacitor discharge design with a step-up transformer. The curve marked ‘B’ is a waveform that can be expected to result from an energiser that does not have a step-up transformer, but that is not capable of interrupting the pulse such as may be the case when using thyristors or triacs. Curves ‘C1, ‘C2’ and ‘C3’ could be pulse waveforms of various duration as produced by one and the same practical embodiment of the invention. The curves clearly illustrate the degree of improved control the invention offers over the waveform and the duration of the pulse as produced by the energiser.

Because the IGBT switching device can be turned off, any energy that remains in the energy storage capacitor will be retained and is available for the next output pulse. This could be nearly all of the initial stored energy but more typically would be around 90% or more as some energy will always be lost in the fence discharge resistors and depends on the load presented by the fence and the pulse duration. In contrast, in traditional designs practically all stored energy in capacitors that commence controlled discharging is expended every pulse. While it is known in some energiser designs that some of the energy can be recycled once the thyristor has commutated to the off-state, this recycled energy is generally limited to 25% or less of the original amount.

The higher efficiency of the switched DC energiser according to the present invention and the retention of unused energy, means that losses internal to the energiser can be much lower than in traditional designs. This directly means that operating temperature inside the energiser casing can be lower than in a traditional energiser of similar output energy. The lower temperature significantly reduces stress on the electronic components and can lead to enhanced product reliability. For example, energy storage capacitors tend to suffer from elevated operating temperatures and are a major cause of field-failure of electric fence energisers. It is believed that the present invention will overcome or go significantly toward overcoming this problem.

The peak pulse current that flows in the energy storage capacitors is greatly reduced in an energiser according to the present invention. This is because there is no voltage step-up transformer. As mentioned previously a typical ratio used in electric fence energisers having a step-up transformer is 10:1. Thus, the current in the primary winding of the step-up transformer is 10 times higher than the current in the secondary winding. Since the primary current also flows in the energy storage capacitor, it follows that the pulse current in a switched DC energiser, according to the present invention, can be 10 times lower in magnitude than in a similarly sized conventional design.

This reduction in current also has a major effect on the reliability of the energy storage capacitor, because current stress on the capacitor follows a function that is proportional to the square of the current. Therefore, stress on the pulse capacitors can be as much as 100 times lower than in traditional designs. This thereby further improves product reliability.

It is also recognised that in the majority of energisers the step-up transformer is a relatively bulky and heavy component. Indeed, it often represents almost half the weight of the product. It, therefore, follows that with the switched DC energiser of the present invention, product weight is reduced. The energiser can thus be mechanically more robust, even in the absence of less reinforcing material and therefore be cheaper and more robust to ship than a conventional design.

The exact control of output pulse duration as provided by the present invention and, therefore, the pulse output voltage means that an energiser according to the present invention can provide output pulse energies higher than that which may be feasible or practical using conventional designs, yet it can still remain compliant with international safety regulations. For example, one of the largest energiser models currently on the market may deliver output energy in the order of 50 joules. A competing switched DC energiser can, by contrast, deliver up to 125 J output energy and energies up to 250 J may be feasible.

The ability to control the pulse duration enables the control circuitry to be arranged to calculate exactly how much energy is delivered to the fence by measuring voltage on energy storage capacitors before and after the pulse and taking the difference. This is something that is not useful with conventional designs, where practically all the energy stored in the capacitors is expended every pulse.

If the energiser incorporates a measurement circuit that monitors the capacitors and/or IGBT current during a pulse, it becomes possible to protect these components from being overstressed during a fault condition or short circuit load condition by almost instantly turning the IGBT off when a predetermined current threshold is exceeded. Once again, this can enhance product reliability. It provides an advantage over traditional design protection of the components under such conditions where it is possible only, to a limited extent, to achieve protection by reducing the voltage to which the energy storage capacitor is charged or by simply ceasing to generate output pulses.

The output impedance of a conventional energiser must always include the copper resistance of the primary and secondary windings of the transformer, the leakage inductance of the transformer and other impedances that normally exist in the circuit that connects to the primary winding of the transformer (e.g. loss resistance of the energy storage capacitor, the thyristor and possible other inductors). Typically this adds up to a total output impedance ranging from several tens to hundreds of ohms.

In an energiser according to the present invention, however, the output impedance is dominated by the loss resistance of the high voltage energy storage capacitor, resistance of the switching device and the resistance of any inductors that might be placed between the switching device and the output terminals 18. Typically this will add up to a few ohms. The very low output impedance of the energiser therefore means that the peak pulse output voltage can become almost independent of the load impedance for all practical loads presented by electric fences. This is in contrast to the peak pulse output voltage of a conventional energiser which reduces considerably as the load impedance is lowered.

In the time interval during which the output pulse is being generated the switched DC energiser can actively monitor the output current and the output voltage and thereby the output energy. Should any of these parameters (voltage, current, energy) reach a level that may be deemed unsafe, then the duration of the output pulse (and any pulses following, if necessary) can be curtailed. For example this might occur if all or part of a fence load is removed just prior to, or during, a pulse (e.g. a cut-out switch may be opened by a user).

Alternatively, the voltage (energy) of the storage capacitor can be dynamically monitored as the pulse delivery progresses and the rate of energy delivery is known. If any pulse delivery parameter (e.g. duration, energy, voltage, current or combinations of the same) reaches a level that may be deemed unsafe, then the duration of the output pulse can be curtailed.

A switched DC energiser according to the present invention does not necessarily have any electrically conductive path to dissipate any charge which may remain on the fence conductors. This arises because of the absence of any step-up transformer and because the switching device 16 is returned to a blocking state to end the output pulse. In a well insulated fence, therefore, conductors could potentially remain charged to a high voltage for a considerable length of time as the electrical charge slowly "leaks" away. This problem may be further increased by the energiser also containing one or more capacitors located in the filter circuit 17 thereby adding to the capacitance of the fence conductors.

As mentioned previously, one or more resistors 19 (in combination with resistor 21) can be connected between the fence output terminals 18 to allow the fence conductors and filter capacitor(s) to discharge and return the voltage on the fence conductors to a low level within a time that may be considered safe.

Figure 2A:
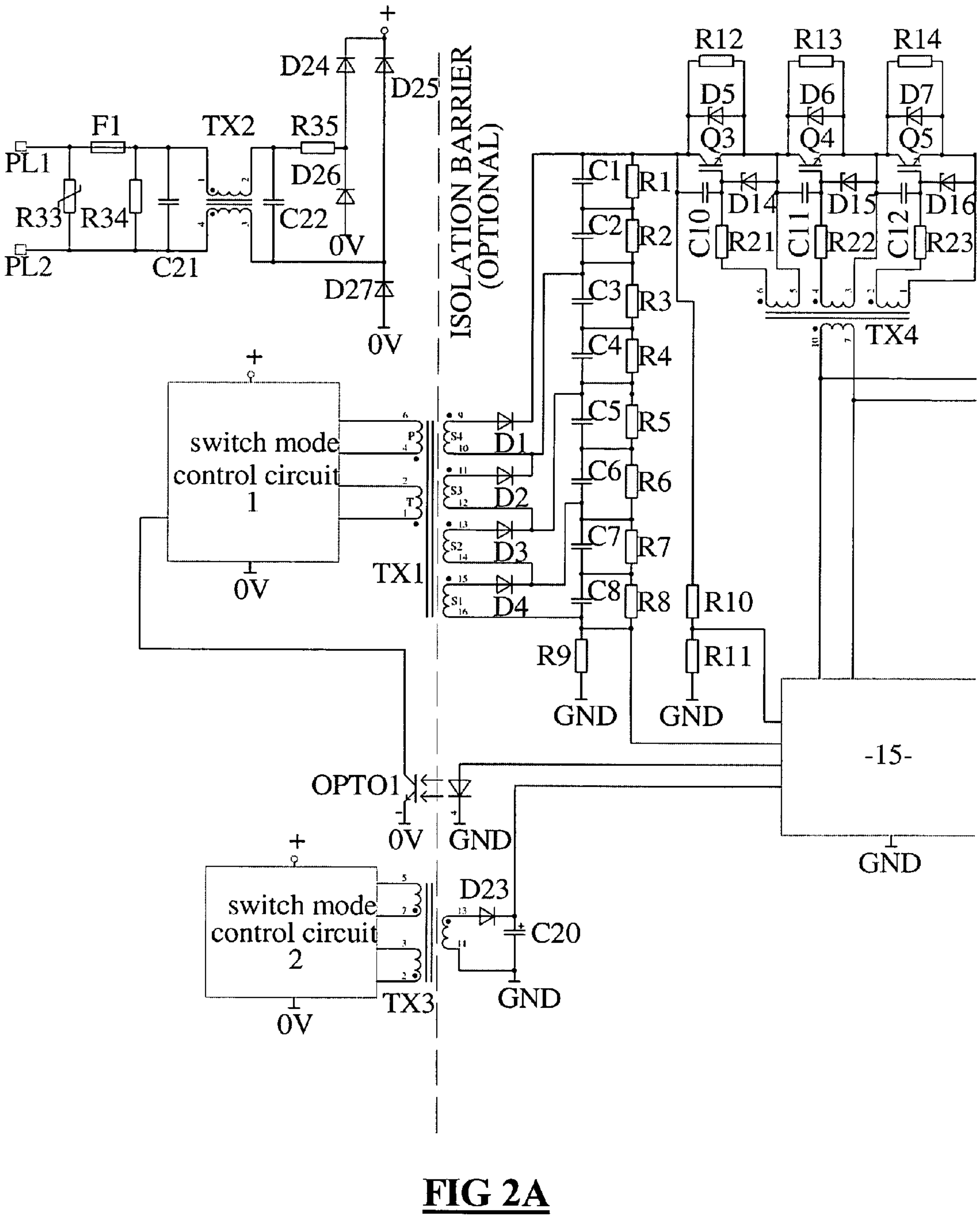
FIGS. 2A and 2B are a more detailed circuit diagram of an electric fence energiser incorporating the present invention.
Figure 2B:
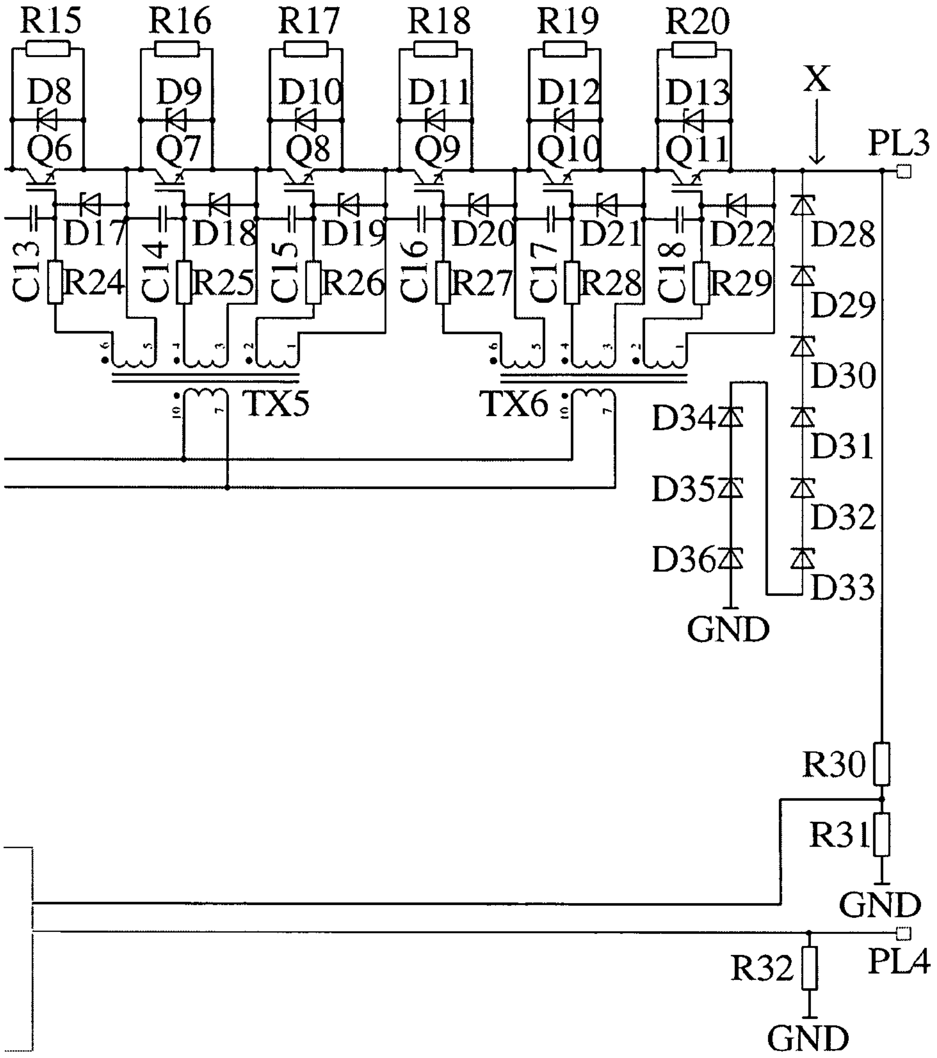

With the foregoing in mind and turning now to FIGS. 2A and 2B of the drawings, a practical embodiment of the present invention is disclosed.

In this practical implementation of the invention the energiser is operated from AC mains power supply, but with modifications the invention can be made suitable for operation on a low voltage DC or AC power supply, e.g. a battery and/or solar panel, or from a combination of mains power and low voltage DC or AC.

The power supply will be connected to terminals PL1 and PL2. The components resistor R33, fuse F1, resistor R34, capacitor C21, transformer TX2, capacitor C22, resistor R35 and diodes D24, D25, D26 and D27 form a mains power input circuit providing safety features, protection features, a filtering function and rectification of the AC voltage and is well known to persons skilled in the art.

The rectified voltage produced by the mains power input circuit, indicated by the terminals with the '+' symbol, is used by two switch mode control circuits. Switch mode control circuit 2, in combination with components transformer TX3, rectifier diode D23 and capacitor C20, provides a low voltage DC supply that is used for the proper operation of the measurement and control circuits.

Switch mode control circuit 1, in combination with transformer TX1 and diodes D1 to D4 form the charging means to provide energy to the energy storage capacitors C1 to C8. In this particular embodiment eight capacitors are connected in series to collectively form a capacitor capable of withstanding a voltage eight times higher than the rating of a single capacitor. This allows the use of lower cost and more commonly available capacitors than if a single capacitor rated to the high voltage was used. Resistors R1 to R8 ensure that the high voltage is equally shared between the capacitors.

Resistor R9 allows measurement of the pulse current flowing through the energy storage capacitors and the high voltage switching devices Q3 to Q11.

Resistors R10 and R11 allow measurement of the combined total voltage to which the energy storage capacitors have been charged.

Opto-coupler OPTO1 allows control of switch mode control circuit 1, either as an on/off control device or as a linear feedback device. Either method allows for control of the maximum voltage to which the energy storage capacitors are charged. The opto-coupler arrangement may also be omitted if one relies solely on other feedback and control circuits such as one that is provided by a tertiary winding 'T' on transformer TX1, or alternatively one may omit the tertiary winding 'T' and rely solely on the opto-coupler. Other means of control of the switch mode control circuit are also feasible such as an isolating transformer or techniques such as primary winding flyback voltage sensing, a technique known to persons skilled in the art.

The high voltage switching device is constructed using IGBTs Q3 to Q11, with additional components resistors R12 to R29, diodes D5 to D22, capacitors C10 to C18 and transformers TX4 to TX6. As can be seen a total number of nine IGBTs is used, which allows the use of low cost, mass produced IGBTs with a maximum voltage rating that is at least one ninth of the maximum high voltage that the energy storage device is to be charged to. In a practical embodiment one may use IGBTs that are rated to 1200V DC, creating a high voltage switching device that may withstand a maximum high voltage of 10,800V DC. Other numbers of IGBTs are also possible, practical numbers ranging from one to perhaps as many as twenty IGBTs.

In the interest of product safety, the maximum blocking voltage of the switching device will generally be made significantly higher than the maximum high voltage the energy storage device will be charged to. In a suggested embodiment one may select the maximum voltage on the energy storage device to be 8,000V DC, and still include a switching device that is capable of blocking up to 10,800V DC. The increased safety then stems from the capability of the switching device to continue to reliably block the high voltage in the event that one or two individual IGBTs may have failed in a short circuit state.

To ensure that, while in the blocking or non-conducting (off-) state, the high voltage is equally shared between the IGBTs resistors R12 to R20 (typically all of equal value) are added.

In the event that one or more of the resistors R12 to R20 becomes open circuit or disconnected diodes D5 to D13 are added to still ensure sharing of the high voltage between the IGBTs. To this effect diodes D5 to D13 are rectifier diodes with a known breakdown voltage (commonly known as avalanche rated diodes) that is lower or equal to the maximum voltage rating of the IGBTs. The diodes D5 to D13 also ensure that no destructive reverse voltage can develop across the IGBTs, a situation that may otherwise occur when transient voltages are present on the conductors of the electric fence.

Capacitors C10 to C18 in combination with resistors R21 to R29 are to ensure that all IGBTs switch on and off at an equal rate. If this provision was not allowed for and one or more IGBTs were to switch on or off appreciably faster than other IGBTs in the energiser, then devices that are relatively slow to turn on may be exposed to excessive voltages and the slower IGBTs and/or the diode parallel to the slower devices may be damaged. Similarly, IGBTs that turn off appreciably faster than others may be exposed to excessive voltages also possibly leading to destruction of the IGBT and/or the parallel diode.

Capacitors C10 to C18 provide a negative feedback path from the collector of each individual IGBT to the gate of that IGBT which will dictate the maximum turn-on and turn-off speed of each device, thereby equalising the turn-on and turn-off speeds of the individual sections of the high voltage switching device.

How the capacitors achieve equalising of turn-on and turn-off speed can easily be understood as follows: Consider one device that turns on slower than the other devices in the switch assembly. Because of its slow turn-on, the transistor may experience a collector to emitter voltage that reduces more slowly than the other transistors or even experience a rising rather than falling collector to emitter voltage. A slowly reducing voltage across the gate to collector capacitor means a lower capacitor discharge current and hence more gate charge for the transistor will be available, aiding in speedy turn-on of that transistor. In the event of an increasing collector to emitter voltage the collector to gate capacitor will experience a charging current which flows into the gate of the transistor and increases the turn-on speed of that transistor.

During turn-off of the transistors the same effect applies but with reversed current directions. It will be necessary to ensure that the values of capacitors C10 to C18 and resistors R21 to R29 are matched within certain tolerances to ensure the turn-on and turn-off speeds of the individual high voltage switching device sections are indeed matched. Similarly, one would normally ensure that the IGBTs themselves are of identical or at least equivalent type.

Pulse transformers TX4 to TX6 provide the required gate-to-emitter control voltages for the individual IGBTs to place the IGBTs in the blocking (non-conductive- or off-) state or in the conducting (on-) state.

Zener diodes D14 to D22 limit the gate-to emitter voltages of the IGBTs to a value that will not cause damage to the IGBTs.

Resistors R30 and R31 allow measurement of the pulse voltage that may be produced on the output terminals of the energiser. These resistors also provide the function of discharging the conductors of the electric fence within an acceptable time when the high voltage switching device is placed in the blocking (non-conductive- or off-) state and there is insignificant load across the fence conductors to achieve this. Further, if resistors R30 and R31 were not present, and the fence conductors were well insulated from earth providing only a very small leakage current even at a high voltage, then the fence conductors would slowly charge up and reach a high voltage even while the high voltage switching device is off, by way of the small current that would flow through resistors R12 to R20. Although this may be considered safe, since resistors R12 to R20 each will generally be of a high value, such as 1 mega-ohm or more, this may be considered an undesirable situation.

In most practical embodiments one may ensure that the combined resistance value of R30 and R31 is several orders of magnitude lower than that of the combined values of resistors R12 to R20.

Diodes D28 to D36 limit the maximum negative voltage that may be present at the right hand terminal of the switching device to a few volts, thereby limiting the maximum blocking voltage across the switching device to not much more than the voltage that is present on the energy storage device. If diodes D28 to D36 are not present the voltage at the right hand terminal of the switching device may go negative by one or even several thousands of volts, perhaps caused by external transient voltages that may be present on the conductors of the electric fence.

Such negative transient voltages would add to the voltage that the switching device must withstand and the maximum rating of the switching device may be exceeded. It is possible to replace diodes D28 to D36 with a single diode or several diodes connected in parallel if one chooses to make use of diodes that are rated to withstand the maximum pulse voltage. If a multitude of diodes are connected in series as shown on the schematic diagram then it may be of advantage to use diodes of avalanche rated types.

Resistor R32 allows for measurement of the pulse current magnitude that flows through the fence conductors.

Terminals PL3 and PL4 may form the output terminals to which the electric fence conductors and an earth terminal may be connected.

The embodiment shown does not include any waveform shaping circuits and/or filter circuits such as may be added to the energiser. Persons skilled in the art may design such waveform shaping and filter circuits as is required by the application, to be incorporated at “X” (FIGS. 2A and 2B).

According to the present invention, therefore, there is provided an energiser that controls output pulse duration (and thereby output energy) by means of a controlled turning -on and -off of a semiconductor switching device which in the preferred form is an IGBT or series of IGBTs. A voltage step-up transformer is not required in the design.

According to a second embodiment of the invention a multitude of energy storage capacitors are essentially connected in parallel during the charging cycle and are essentially connected in series at discharge. As a result of this configuration potential problems which can arise by charging the energy storage capacitor up to high combined voltages e.g. 8000 volt can be overcome or lessened.

Figure 4:
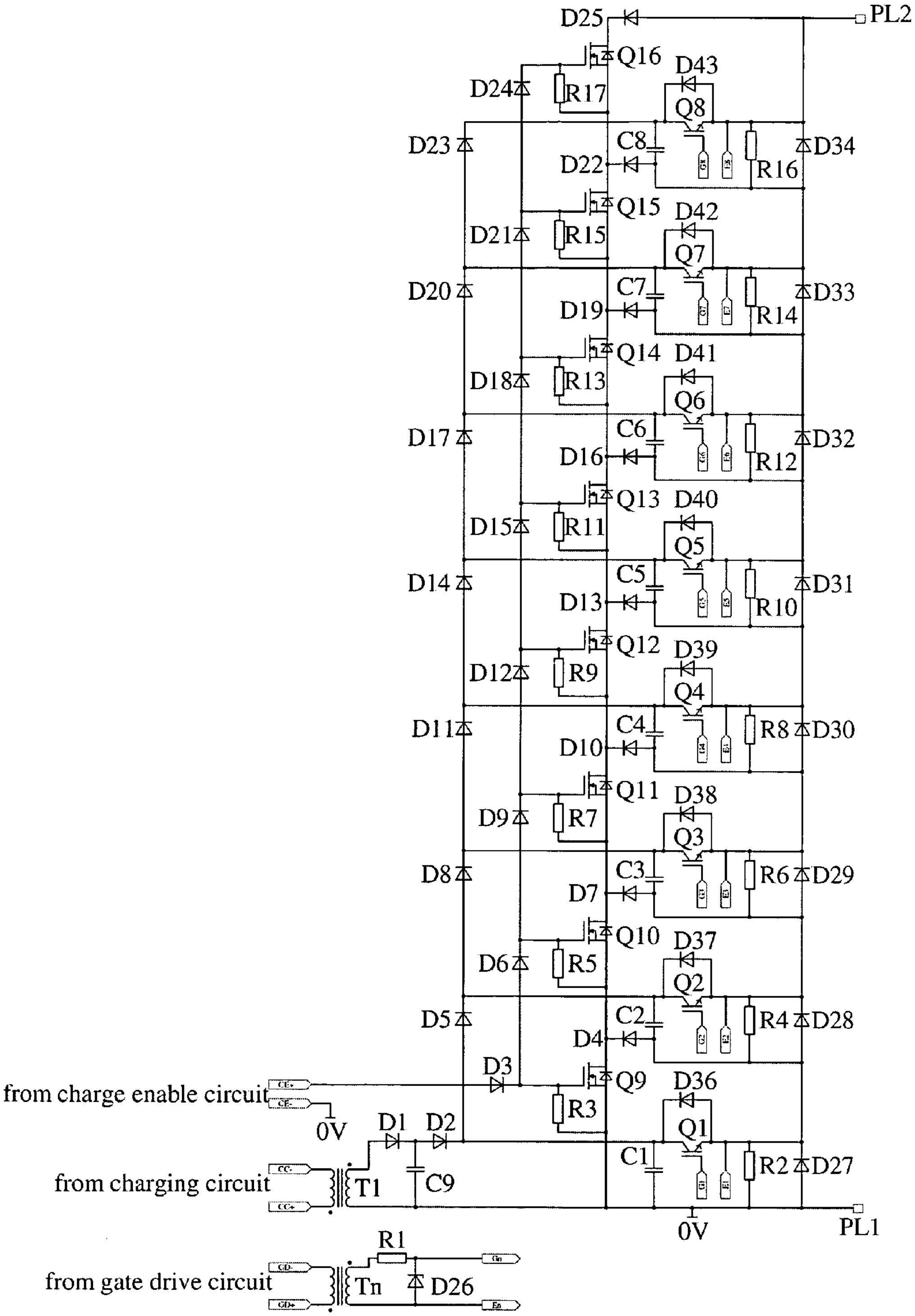
FIG. 4 is a circuit diagram of an electric fence energiser incorporating the present invention according to a second embodiment.

Referring to FIG. 4, eight energy storage capacitors C1 to C8 are shown. Transistors Q1 to Q8 are eight switching transistors (IGBT) capable of switching high voltage and high current (e.g. 1200V, 100 A). Transistors Q9 to Q16 are switching transistors (MOSFETs are shown but could also be IGBTs, BJTs or thyristors (SCR)) capable of switching high voltage and low current (e.g. 1000V, 1 A).

Transistors Q1 to Q8 are controlled by signals from gate trigger circuits that are transferred to the transistor gate-emitter connections (labelled Gn and En where n=1 . . . 8) via transformers Tn (n=1 . . . 8).

Figure 5:
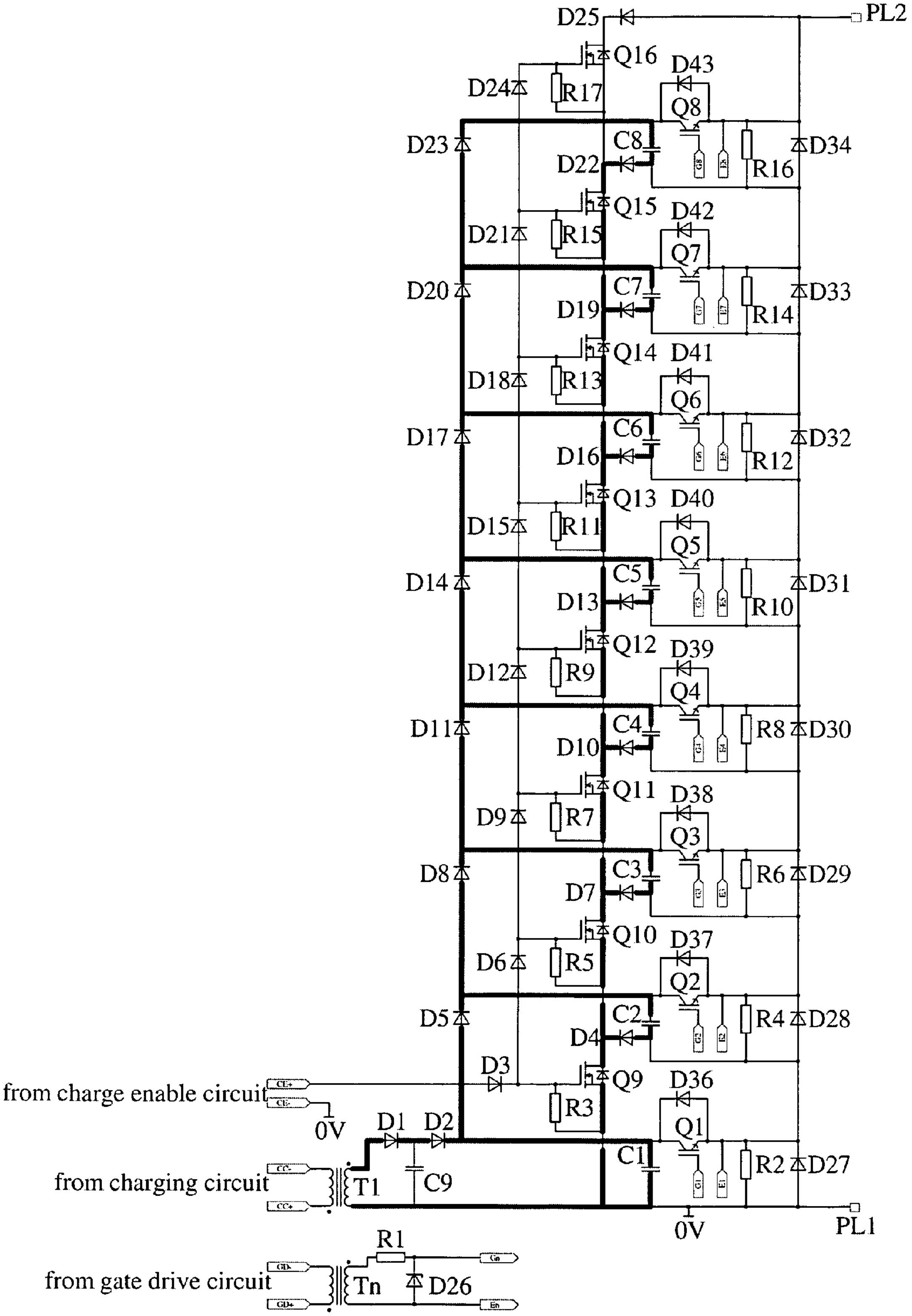
FIG. 5 is a circuit diagram as shown in FIG. 4 but illustrating the charging state of the energiser.

FIG. 5 shows the circuit of this embodiment in the charging state.

A voltage of approximately +15V DC is applied to terminal CE+. This ensures that MOSFETs Q9 to Q16 are all in the conducting (on) state, and they all present a relatively low resistance between the drain and source terminals (typically in the order of a few ohms for each MOSFET).

The charging circuit is then activated and an AC voltage is developed on the secondary winding of transformer T1. Energy storage capacitor C1 commences charging due to the current that will flow though diodes D1 and D2. (This current flow is indicated by the thick lines in the diagram). Similarly, capacitor C2 commences charging due to the current through diodes D1, D2, D5, D4 and transistor Q9. Capacitor C3 commences charging due to the current through diodes D1, D2, D5, D8, D7 and transistors Q9 and Q10.

The same occurs for the other five capacitors C4 to C8. It will therefore be evident that all the capacitors charge simultaneously from the same source and therefore charge to nearly the same voltage (the difference is limited to a diode forward conduction voltage and the voltages developed across the MOSFETs, which is low due to the low on-state resistance of the MOSFETs).

It should be noted that MOSFET Q16, diodes D24 and D25 and resistor R17 are not strictly required for operation of the circuit. They can be omitted from the circuit without significant change in operation. MOSFET Q16 may be included as it may help to restrict the output voltage to a very low value during charging of the energy storage capacitors and thus improve safety or reliability or both.

Once charging of the energy storage capacitors is complete the charging circuit is turned off and the voltage on terminal CE+ is reduced from 15V to 0V. MOSFETs Q9 to Q16 turn off and present a high impedance. At this point all the energy storage capacitors are charged, e.g. to 1000V each, but the output voltage is still zero due to transistors Q1 to Q8 being held in the -off (non-conducting) state, combined with the presence of resistors R2, R4, . . . , R16.

It is possible to achieve the same operation without requiring the MOSFETs. In this case one would use a multitude of secondary windings on supply transformer T1 or alternatively a multitude of supply transformers. This does not significantly affect the other aspects of the circuit.

Figure 6:
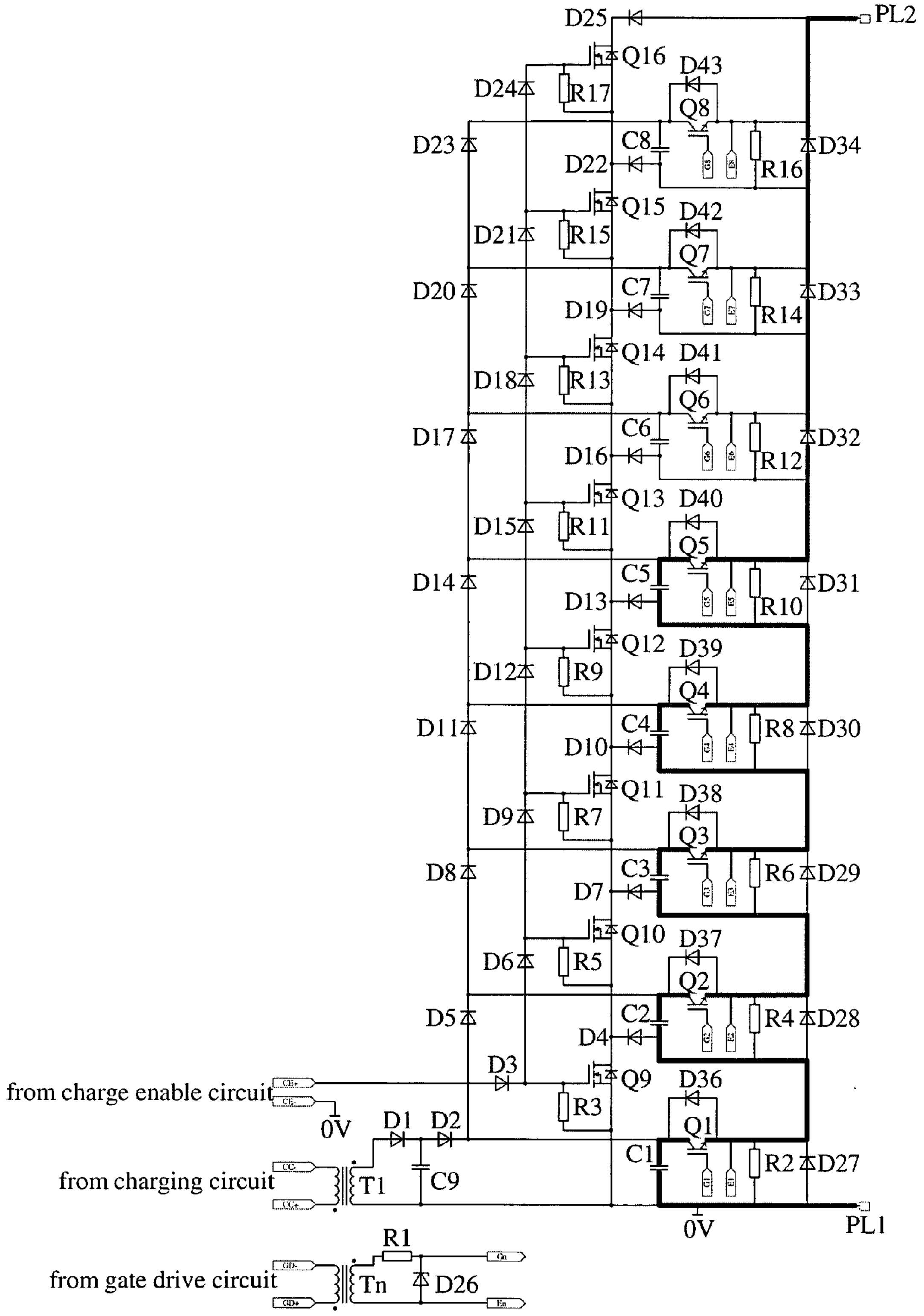
FIG. 6 is similar to FIG. 5 but showing the energiser in a discharge state.

FIG. 6 shows the circuit in the discharge state i.e. during the generation of an output pulse.

Unlike the first embodiment disclosed herein where the energy storage capacitor(s) are charged up to a high combined voltage e.g. 8000V the arrangement of the second embodiment is that the multitude of energy storage capacitors are charged up to a voltage of much lower magnitude (e.g. 1000V). Because during the charging cycle the capacitors are essentially connected in parallel there are no voltages higher than 1000V present in the circuit. This overcomes problems which can arise when voltages of say 8000V are generated and may be present in the energiser continuously except when an external heavy load is connected to the energiser.

Once the charging cycle has been completed the set of transistors that connect the capacitors C1 to C8 in parallel are turned off. Consequently there is no voltage present which is over 1000V.

Only when the energiser is commanded by the control circuit to generate a high voltage output pulse are the second set of transistors Q1 to Q8 or any combination thereof turned on. This second set of transistors essentially connects the energy storage capacitors in series. The voltage present on each capacitor is thus added to create a sum voltage that may be as high as 8000V or even higher. This high voltage is thus only present for the duration of the energiser output pulse (e.g. 100 microseconds).

As the charging circuit only has to generate 1000V the design is easier, lower cost and simplified over the first embodiment. This is especially the case with the switching transformer (if employed) which becomes simpler, lower cost and may offer improved reliability. Also other methods of charging the energy storage capacitors can be used e.g. by means of a mains "voltage doubler" circuit.

With the second embodiment the charging voltage can more easily be generated from a low supply voltage such as 12V or 24V. Thus the voltage can be generated by using battery supply, battery backup and operation from solar panels as well as from mains supply.

With the second embodiment, each switching transistor can be controlled independently thus it is possible to independently choose to either discharge or not discharge each energy storage capacitor. For example, in a circuit with eight energy storage capacitors each charged up to a voltage of 1000V it is possible to control the peak output voltage in discrete steps of 1000V from 0V to 8000V. Referring to FIG. 6, one or more of diodes D27 to D34 conduct current to the pulse out terminal PL2 when its corresponding transistor Q1 to Q8 is held in the -off (non-conducting) state whilst others of Q1 to Q8 are in the -on (conducting) state. In FIG. 6 the thick lines signify discharge current path and in this example show that current flows through diodes D32 to D34, whereby transistors Q6 to Q8 are held in the -off (non-conducting) state whilst transistors Q1 to Q5 conduct. If finer control is required then the control of the voltage on the energy storage capacitors can be controlled similar to the earlier described embodiment.

An added advantage of the possibility of the control method with discrete steps is that the output energy at reduced peak output voltage can be higher for the second embodiment. For example, in the first embodiment a possible energiser design could deliver energy of 80 J at 8000V and 20 J at 4000V. With the second embodiment the energiser could deliver 80 J at 8000V and 40 J at 4000V.

Figure 7:
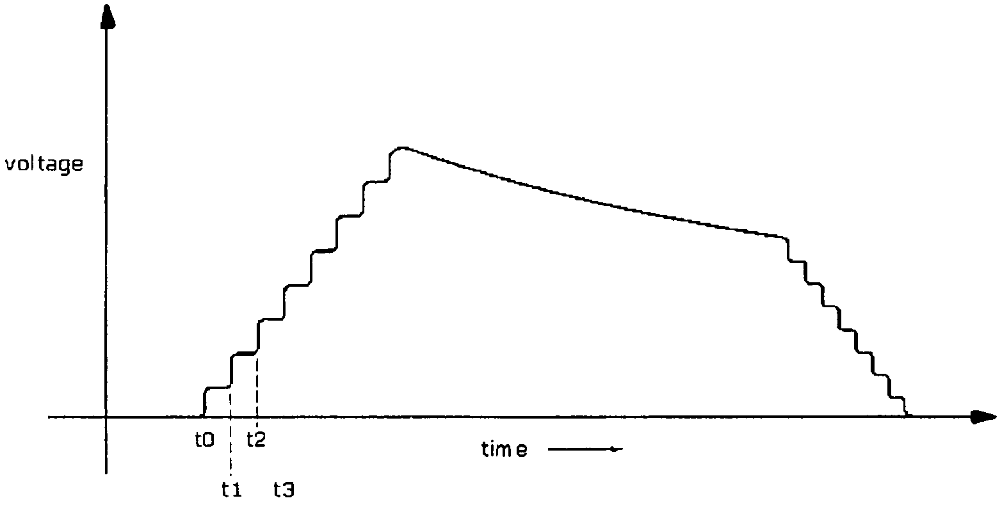
FIG. 7 is a graphical representation of a possible pulse voltage waveform.

The skilled person will also appreciate that it would be possible to control the switching transistors so that they turn on and off at different times and, therefore, provide a measure of control over the pulse wave form. For example, it would be possible to generate a pulse that resembles a sinusoidal wave form. Such techniques may be of advantage in controlling or reducing electrical interference signals generated by the energiser. An example of a possible output waveform is shown in FIG. 7. Referring to FIGS. 6 and 7, the stepped waveform can be achieved by first turning on IGBT Q1 at time t0, followed by IGBT Q2 at t1, Q3 at t2 and so forth. The stepped waveform at the end of the pulse is achieved using the same technique when turning the IGBTs off.

An energiser constructed according to the second embodiment may also be able to intelligently adapt to load impedance by first turning on one or a few of the switching transistors, measuring the load current that flows and using that information to switch on or not switch on the remaining switching transistors. This arrangement offers increased product reliability since excessive currents through the transistors (e.g. due to a short circuit load) can be avoided entirely. For small fences the same technique can be used to detect changes in load on the fence (e.g. when an animal touches the fence wire) and provide one or a few large pulses when such a load change is detected. This technique can offer improved safety to animals and persons near the electric fence system.

The present invention in its various forms is believed to improve the electronic circuits in the electric fence energiser to minimise energy loss in said circuits whilst allowing wide-ranging control over pulse duration. The reduced energy loss means less heat will be generated inside the housing of the energiser and therefore the energiser may operate at a lower internal temperature than does a similar rated and sized energiser of conventional design. For most, if not all, electronic circuits reliability of the components is increased when operated at a lower temperature, bringing benefits both to the customer and to the manufacturer.

An energiser based on this invention can be made considerably more powerful than a conventional design when housed in a product casing of similar size and shape. It is possible to design an energiser based on this invention that is capable of proving a pulse energy at least twice that of any currently available product whilst being housed in a similar sized or smaller casing and yet operate at a lower internal temperature than currently available products, for any load impedance connected to the energiser.

What is claimed is:

1. An electric fence energiser including a plurality of energy storage capacitors, a charging circuit to enable at least some of the energy storage capacitors to be charged from an energy source, first semi-conductor switching means arranged to effectively connect in parallel the energy storage capacitors to be charged and second semi-conductor switching means to connect two or more of the charged energy storage capacitors in series to create an output pulse.

2. An energiser as claimed in claim 1 wherein the turn-on and -off speed of the individual devices is controlled by means of components connected to the semiconductor switching devices.

3. An energiser as claimed in claim 2 wherein the semiconductor switching devices of each of the first and second semiconductor switching means are arranged to be controlled independently.

4. An energiser as claimed in claim 1 wherein the semiconductor switching means is constructed from a multitude of semiconductor switching devices selected from an insulated gate bipolar transistor (IGBT), a bipolar junction transistor (BJT) or a power MOSFET (metal oxide semiconductor field effect transistor).

5. An energiser as claimed in claim 1 wherein the semiconductor switching means is constructed from a multitude of semiconductor switching devices selected from an insulated gate bipolar transistor (IGBT), a bipolar junction transistor (BJT) or a power MOSFET (metal oxide semiconductor field effect transistor).

6. An energiser as claimed in claim 4 or 5 wherein the semiconductor switching means is a multitude of the IGBT, BJT and MOSFET devices.

7. An energiser as claimed in claim 1 wherein the first semiconductor switching means is a multitude of semiconductor switching devices selected from an insulated gate bipolar transistor (IGBT), metal oxide semiconductor field effect transistor (MOSFET), bipolar junction transistor (BJT) or thyristor capable of switching high voltage and low current.

8. An energiser as claimed in claim 1 wherein the second semiconductor switching means is a multitude of semiconductor switching devices each of which is an insulated gate bipolar transistor (IGBT) capable of switching high voltage and high current.

9. An energiser as claimed claim 1 further including a control circuit to control the second semiconductor switching means is arranged to turn on and off the semiconductor switching devices at different times to control pulse wave form.

10. An energiser as claimed in claim 1 further including a control circuit to control the first and second semiconductor switching means that includes load current sensing means to determine load on the energiser, the control circuit being arranged to adapt to load by selective control of the semiconductor switching means.

11. An energiser as claimed in claim 1 wherein the energiser calculates the energy delivered to a load connected to output terminals of the energiser by measuring the energy stored in the energy storage capacitor(s) prior to and after each output pulse and calculating the difference.

12. An energiser as claimed in claim 1 wherein the energy source can be AC mains power supply, a low voltage DC or AC power supply or a combination of low voltage DC or AC and AC mains power supply.

13. An energiser as claimed in claim 1 wherein the energy source is a low voltage DC or AC power supply formed by at least one of a battery and a solar panel.

14. An energiser as claimed claim 1 when arranged to produce a series of pulses of controlled amplitude, duration and separation in place of a single pulse of equivalent energy.

15. An energiser as claimed in claim 14 wherein the series of pulses is used for fence wire communication and to selectively control other devices connected to conductors of an electric fence or for the transmission of other information over said conductors.

16. An energiser as claimed in claim 1 wherein the energiser is arranged to be controlled by a remote control.

* * * * *